US011183495B2

(12) United States Patent
Lee et al.

(10) Patent No.: US 11,183,495 B2
(45) Date of Patent: Nov. 23, 2021

(54) POWER SEMICONDUCTOR DEVICES

(71) Applicant: SEMICONDUCTOR COMPONENTS INDUSTRIES, LLC, Phoenix, AZ (US)

(72) Inventors: Sun-hak Lee, Anyang-si (KR); Yong Zhong Hu, Cupertino, CA (US); Hye-mi Kim, Bucheon-si (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 117 days.

(21) Appl. No.: 16/522,388

(22) Filed: Jul. 25, 2019

(65) Prior Publication Data

US 2019/0348412 A1 Nov. 14, 2019

Related U.S. Application Data

(62) Division of application No. 14/845,939, filed on Sep. 4, 2015, now Pat. No. 10,366,981.

(30) Foreign Application Priority Data

Sep. 5, 2014 (KR) ........................ 10-2014-0119384

(51) Int. Cl.
| | |
|---|---|
| *H01L 27/06* | (2006.01) |
| *H01L 29/808* | (2006.01) |
| *H01L 29/10* | (2006.01) |
| *H01L 29/66* | (2006.01) |
| *H01L 29/861* | (2006.01) |
| *H01L 29/06* | (2006.01) |

(52) U.S. Cl.
CPC ...... *H01L 27/0629* (2013.01); *H01L 29/1075* (2013.01); *H01L 29/1095* (2013.01); *H01L 29/66128* (2013.01); *H01L 29/66901* (2013.01); *H01L 29/808* (2013.01); *H01L 29/8611* (2013.01); *H01L 29/0692* (2013.01)

(58) Field of Classification Search
CPC ............ H01L 27/0629; H01L 29/1075; H01L 29/1095; H01L 29/66128; H01L 29/66901; H01L 29/808; H01L 29/8611
See application file for complete search history.

(56) References Cited

U.S. PATENT DOCUMENTS

| | | | |
|---|---|---|---|
| 7,064,407 B1 | 6/2006 | Mallikarjunaswamy | |
| 8,217,487 B2 * | 7/2012 | Choi | H03K 17/063 257/500 |
| 9,257,502 B2 * | 2/2016 | Kim | H01L 29/66325 |
| 2004/0207965 A1 | 10/2004 | Ausserlechner | |
| 2013/0248947 A1 | 9/2013 | Kim et al. | |

FOREIGN PATENT DOCUMENTS

| | | |
|---|---|---|
| KR | 10-2010-0116878 A | 11/2010 |
| KR | 20100116878 A | 11/2010 |
| KR | 20140006156 A | 1/2014 |

* cited by examiner

*Primary Examiner* — Dale E Page
*Assistant Examiner* — Quovaunda Jefferson
(74) *Attorney, Agent, or Firm* — Brake Hughes Bellermann LLP

(57) ABSTRACT

A power semiconductor device includes a diode part disposed in a first region of a substrate, a junction field effect transistor (JFET) part disposed in a second region adjacent to the first region of the substrate, an anode terminal disposed on the first region of the substrate, and a cathode terminal disposed on the second region of the substrate.

20 Claims, 11 Drawing Sheets

POWER SEMICONDUCTOR DEVICES

CROSS-REFERENCE TO RELATED APPLICATIONS

This application is a divisional of non-provisional application Ser. No. 14/845,939, filed on Sep. 4, 2015, which claims priority to and the benefit of Korean Patent Application No. 10-2014-0119384, filed on Sep. 5, 2014 in the Korean Intellectual Property Office, the disclosures of which are incorporated herein by reference in their entireties.

TECHNICAL FIELD

The inventive concepts of exemplary embodiments relate to power semiconductor devices, and more particularly, to a high voltage integrated circuit (HVIC) type power semiconductor device including a bootstrap circuit.

BACKGROUND

A high-voltage integrated circuit, in which one or more high-voltage transistors are disposed on the same chip together with low-voltage circuits, is widely used in a power control system, for example, such as a switching power supply or a motor driver. A high-voltage integrated circuit includes a high-voltage unit and a low-voltage unit. Level shift elements are arranged between the high-voltage unit and the low-voltage unit to level-shift a signal from the low-voltage unit and provide the level-shifted signal to the high-voltage unit. Laterally diffused MOS (LDMOS) transistors are used as the level shift elements. However, the LDMOS transistors have limitations with respect to a low breakdown voltage and a high on-resistance. In addition, when bootstrap diodes are connected to the outside of the high-voltage integrated circuit, the entire module size may increase, and thus its integration may be difficult.

SUMMARY

The concepts of example embodiments can include providing a power semiconductor device including a bootstrap circuit.

The concepts of example embodiments can also include providing a power semiconductor device with a high breakdown voltage and a low on-resistance.

One aspect of the exemplary embodiments include a power semiconductor device including: a diode part disposed in a first region of a substrate; a junction field effect transistor (JFET) part disposed in a second region adjacent to the first region of the substrate; an anode terminal disposed on the first region of the substrate; and a cathode terminal disposed on the second region of the substrate, in which the diode part includes a p-type body region disposed inside the substrate and electrically connected with the anode terminal, an n-type well disposed on one side of the p-type body region and having a first impurity concentration, and a first n-type semiconductor region disposed below the p-type body region and having a second impurity concentration which is lower than the first impurity concentration.

A bottom of the p-type body region may be positioned at a higher level than a bottom of the n-type well.

An upper portion of a sidewall of the n-type well may surround the p-type body region, and a lower portion of the sidewall of the n-type well may surround the first n-type semiconductor region.

The power semiconductor device may further include a lower barrier region formed below the first n-type semiconductor region and the n-type well in the first region of the substrate.

A bottom of the n-type well may be in contact with a top of the lower barrier region.

The first n-type semiconductor region may be in contact with a top of the lower barrier region.

A bottom of the p-type body region may not be in contact with a top of the lower barrier region.

The p-type body region and the first n-type semiconductor region may overlap each other in a direction perpendicular to an upper surface of the substrate.

The p-type body region and the first n-type semiconductor region may define a p-n junction diode.

The power semiconductor device may further include: a lateral p-type well disposed on one side of the n-type well in the first region of the substrate; and a lateral n-type well disposed on one side of the lateral p-type well such that the lateral p-type well is positioned between the lateral n-type well and the n-type well.

Another aspect of the exemplary embodiments can include a power semiconductor device including: a diode part disposed in a first region of a substrate; a junction field effect transistor (JFET) part disposed in a second region adjacent to the first region of the substrate; an anode terminal disposed on the first region of the substrate; and a cathode terminal disposed on the second region of the substrate, in which the JFET part includes a second n-type semiconductor region disposed inside the substrate, a p-type field forming layer disposed on the second n-type semiconductor region, and an n-type buried layer disposed below the second n-type semiconductor region.

The n-type buried layer may overlap the cathode terminal in a direction perpendicular to an upper surface of the substrate.

At least one part of the n-type buried layer may overlap the p-type field forming layer in a direction perpendicular to the upper surface of the substrate.

The second n-type semiconductor region may have a first impurity concentration, and the n-type buried layer may have a second impurity concentration greater than the first impurity concentration.

The power semiconductor device may further include an n-type lower layer disposed adjacent to the n-type buried layer below the cathode terminal in which the n-type lower layer may have a third impurity concentration greater than the second impurity concentration of the n-type buried layer.

Still another aspect of the exemplary embodiments can include a power semiconductor device including: a base substrate including a semiconductor material; a semiconductor material layer disposed on the base substrate and including a first region and a second region; a diode part disposed in the first region of the semiconductor material layer and including a p-type body region disposed in an upper portion of the semiconductor material layer, an n-type well disposed on one side of the p-type body region, and a first n-type semiconductor region disposed below the p-type body region and having a first impurity concentration; and a junction field effect transistor (JFET) part disposed in the second region of the semiconductor material layer and including a p-type field forming layer disposed in an upper portion of the semiconductor material layer and a second n-type semiconductor region disposed below the p-type field forming layer and having a second impurity concentration, in which the first impurity concentration is substantially same as the second impurity concentration.

The power semiconductor device may further include: an anode terminal disposed on the first region of the semiconductor material layer and electrically connected with the p-type body region; and a cathode terminal disposed on the second region of the semiconductor layer and electrically connected with the second n-type semiconductor region.

The power semiconductor device may further include a lower barrier region disposed below the first n-type semiconductor region and the n-type well inside the base substrate; and an n-type buried layer disposed below the second n-type semiconductor region inside the base substrate.

The n-type buried layer may have a third impurity concentration greater than the second impurity concentration.

The semiconductor material layer may include a silicon epitaxial layer including an n-type impurity, in which the first n-type semiconductor region and the second n-type semiconductor region may be portions of the silicon epitaxial layer.

DETAILED DESCRIPTION

Figure 1:
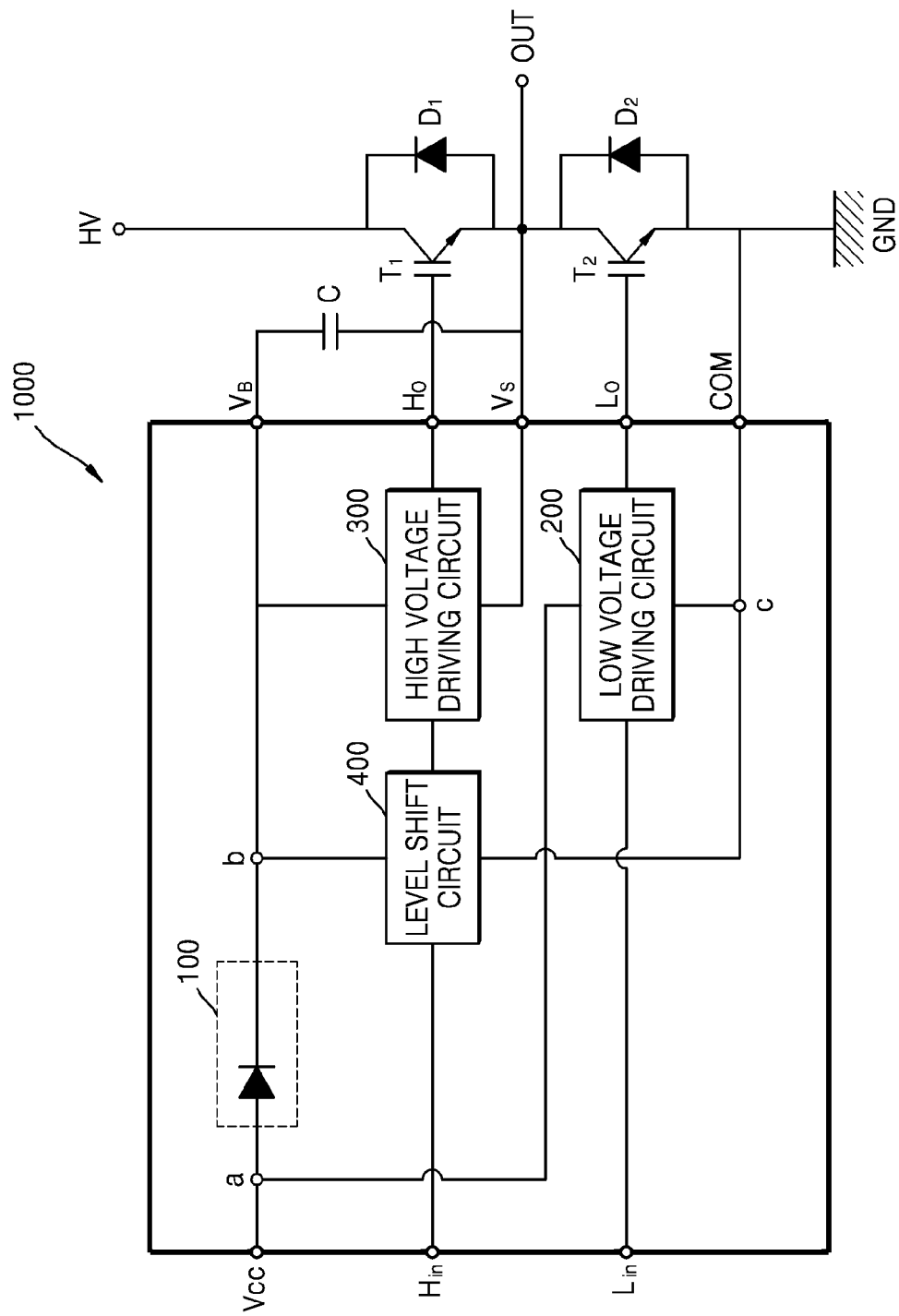
FIG. 1 is an equivalent circuit diagram of a power semiconductor device according to exemplary embodiments.

Hereinafter, several embodiments will be described in detail with reference to the accompanying drawings. However, the embodiments are provided for those skilled in the art to fully understand the concepts. The concepts may, however, be embodied in many different forms and should not be construed as being limited to the embodiments set forth herein. Rather, these embodiments are provided so that this disclosure will be thorough and complete, and will fully convey the concepts to those skilled in the art. As used herein, the term "and/or" includes any and all combinations of one or more of the associated listed items. Like reference numerals denote like elements. Also, various elements and regions are schematically illustrated in the drawings. Thus, the concepts are not limited to sizes and intervals illustrated in the drawings.

FIG. 1 is an equivalent circuit diagram of a power semiconductor device according to exemplary embodiments.

Referring to FIG. 1, a power semiconductor device 1000 may include a bootstrap driving circuit 100, a low-voltage driving circuit 200, a high-voltage driving circuit 300, and a level shift circuit 400. A bootstrap capacitor C may be connected in parallel with power terminals $V_B$ and $V_S$ that provide power to the high-voltage driving circuit 300. An output terminal $H_O$ of the high-voltage driving circuit 300 may be connected to a gate of a first power transistor $T_1$. The first power transistor $T_1$ may be connected in parallel with a first diode $D_1$. A collector of the first power transistor $T_1$ may be connected to a high voltage HV. The first power transistor $T_1$ and a second power transistor $T_2$ may be connected in series. The emitter of the second power transistor $T_2$ may be connected with a ground GND. The first and second power transistors $T_1$ and $T_2$ may include, for example, an insulated gate bipolar junction transistor (IGBT), a bipolar junction transistor (BJT), a metal oxide semiconductor field effect transistor (MOSFET), etc.

The low-voltage driving circuit 200 may control the second power transistor $T_2$ by outputting a low-voltage control signal to a low-voltage output terminal $L_O$ according to a signal that is input through a low-voltage input terminal $L_{in}$. The low-voltage driving circuit 200 may receive power due to a potential difference between a common terminal COM, e.g., a ground voltage and a driving power source $V_{CC}$, and may be operated by the power.

The high-voltage driving circuit 300 may control the first power transistor $T_1$ by outputting a high-voltage control signal to a high-voltage control terminal $H_O$ in response to a signal provided from the level shift circuit 400. The high-voltage driving circuit 300 may receive power by the bootstrap capacitor C connected between the terminal $V_S$ having the same potential as an output terminal OUT and the terminal $V_B$ and may be operated by the power.

The level shift circuit 400 may provide a signal input from a high-voltage input terminal $H_{in}$ to the high-voltage driving circuit 300. A reference voltage of the high-voltage driving circuit 300 may be a high voltage or low voltage according to a state of a signal output from the output terminal OUT. Even when the reference voltage of the high-voltage driving circuit 300 is changed, the level shift circuit 400 may provide a logic value (0 or 1) input from the high-voltage input terminal $H_{in}$ to the high-voltage driving circuit 300. The level shift circuit 400 may include a set level shift element for outputting an on-signal and a reset level shift element for outputting an off signal. Such a set level shift element or reset level shift element may include a laterally diffused MOS (LDMOS).

Figure 2:
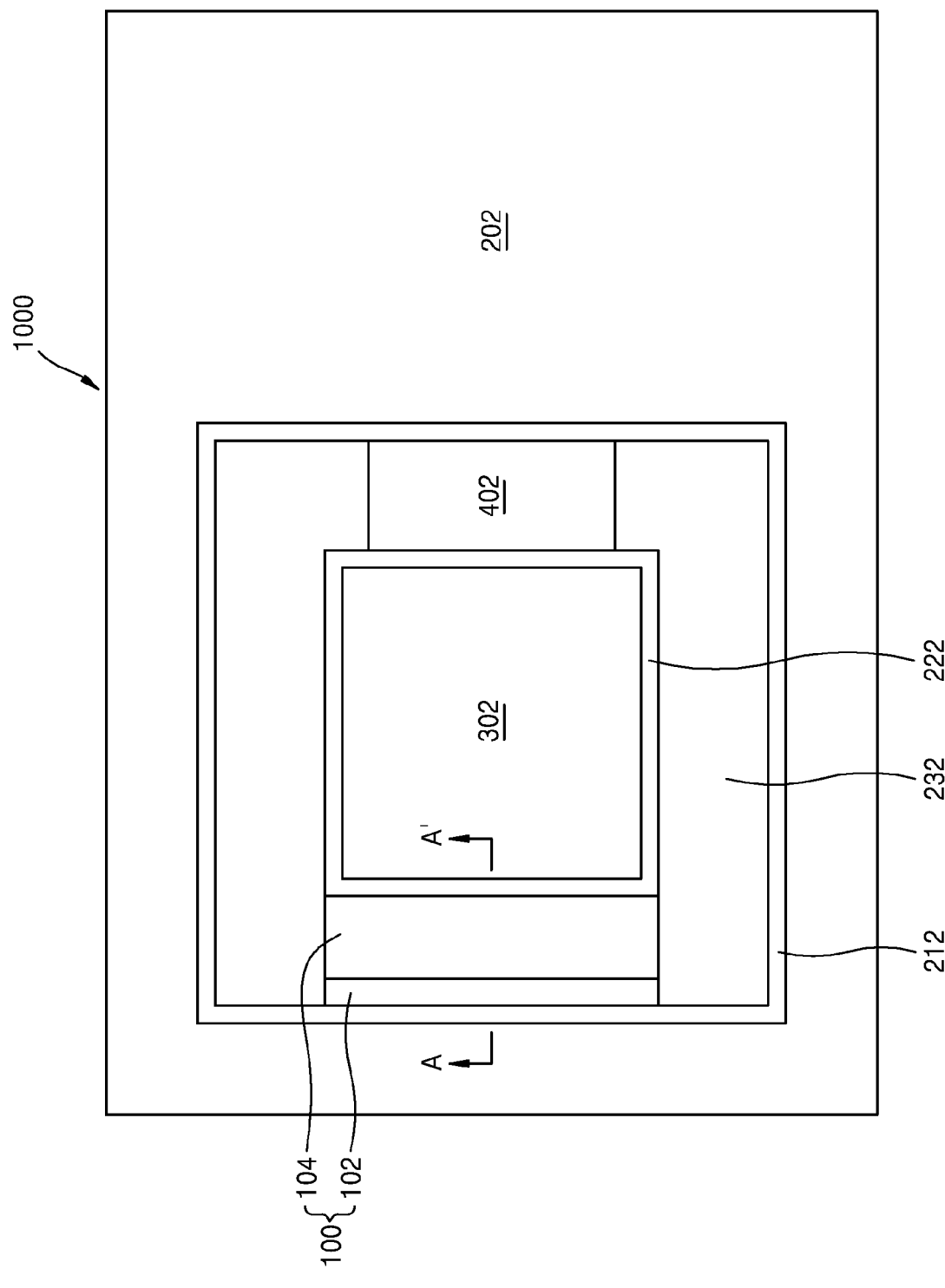
FIG. 2 is a schematic plan view of a power semiconductor device according to exemplary embodiments.

FIG. 2 is a schematic plan view of the power semiconductor device 1000 according to exemplary embodiments.

Referring to FIG. 2, the power semiconductor device 1000, which is formed on a substrate (not shown), may include a high-voltage region 302 and a low-voltage region 202 formed to surround the high-voltage region 302. A first isolation region 212, a second isolation region 222, and a junction termination region 232 may be formed between the high-voltage region 302 and the low-voltage region 202. The junction termination region 232 may be a region that isolates the high-voltage region 302 from the low-voltage region 202.

The low-voltage driving circuit 200 (see FIG. 1) may be formed in the low-voltage region 202, and the high-voltage driving circuit 300 (see FIG. 1) may be formed in the high-voltage region 302. A level shift region 402 may be disposed within the junction termination region 232. The level shift circuit 400 (see FIG. 1) for transferring a control signal provided through the high-voltage input terminal formed in the low-voltage region 202 to the high-voltage region 302 may be formed in the level shift region 402.

The bootstrap driving circuit 100 may be formed in the junction termination region 232. The bootstrap driving circuit 100 may include a diode part 102 and a junction field effect transistor (JFET) part 104. The diode part 102 may be formed adjacent to the low-voltage region 202. The JFET part 104 may be formed between the diode part 102 and the high-voltage region 302.

Although the bootstrap driving circuit 100 is shown in FIG. 2 as being positioned opposite the level shift region 402, a width, length, and position of the bootstrap driving circuit 100 may vary depending on a level of the high voltage. For example, the bootstrap driving circuit 100 is shown in FIG. 2 as being connected to one edge of the high-voltage region 302. However, the bootstrap driving circuit 100 may be formed to be connected to two or three edges of the high-voltage region 302 with the second isolation region 222 interposed therebetween.

Figure 3:
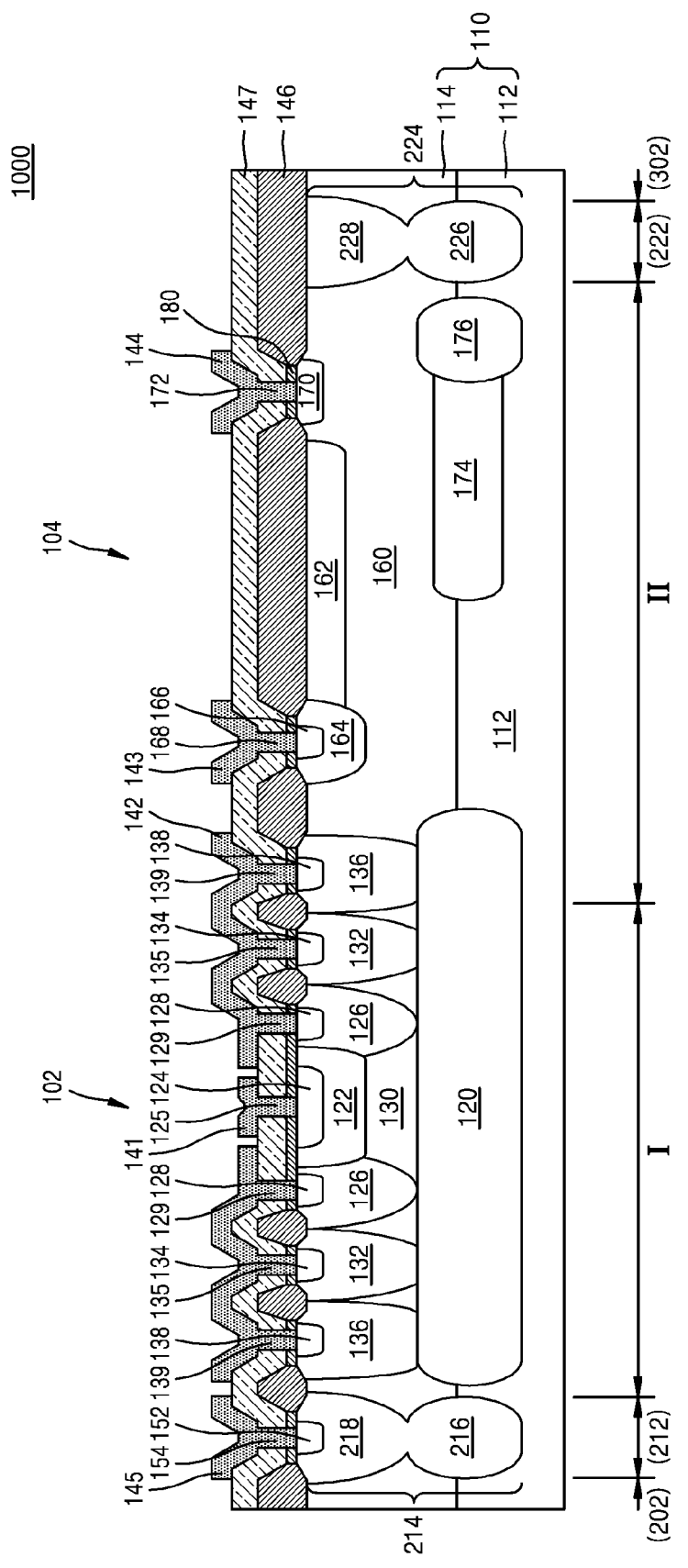
FIG. 3 is a cross-sectional view of a power semiconductor device according to exemplary embodiments taken along line A-A' of FIG. 2.
Figure 4:
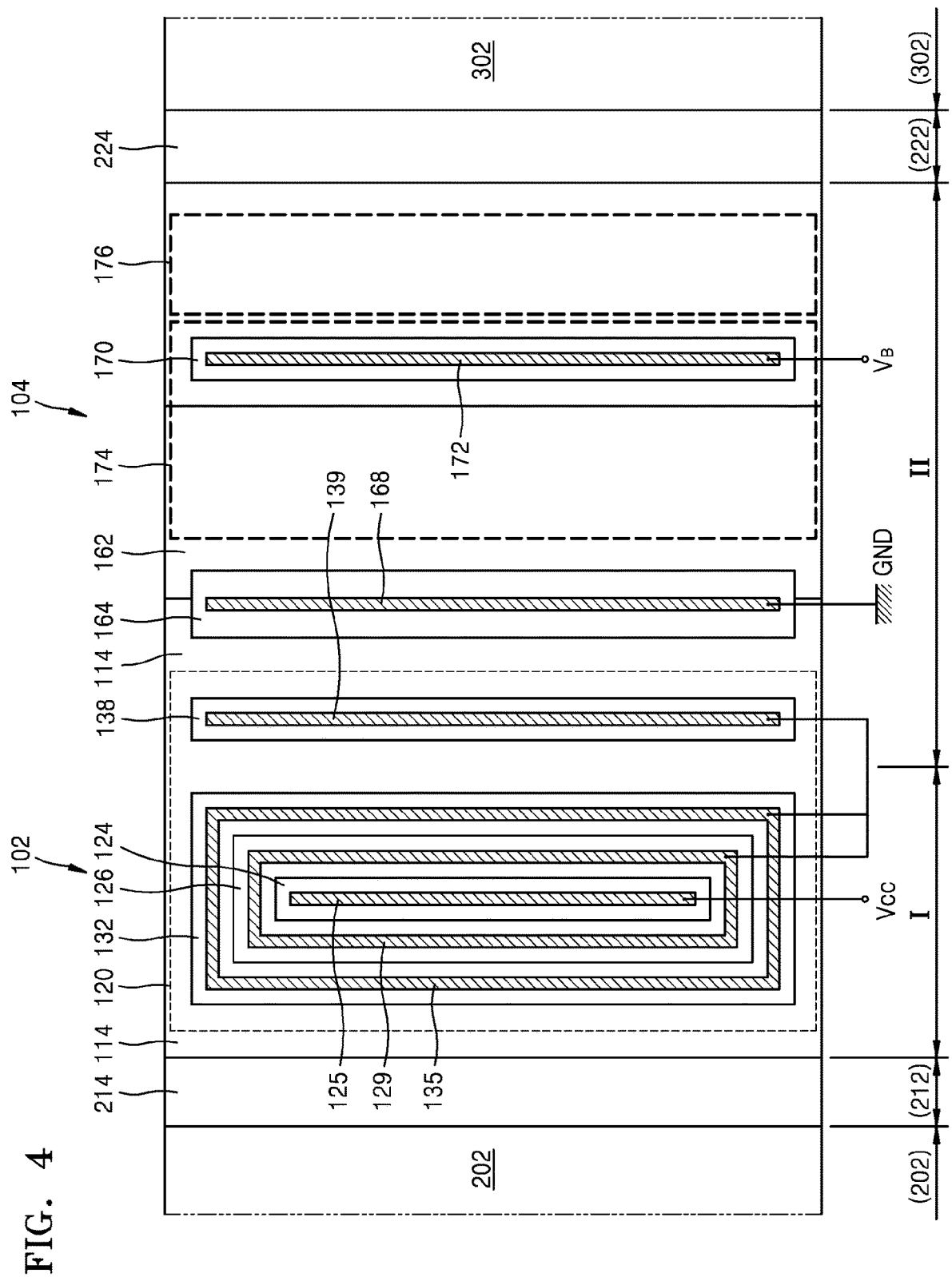
FIG. 4 is an enlarged view of a bootstrap driving circuit of FIG. 2 and a schematic plan view of a structure shown in FIG. 3.

FIG. 3 is a cross-sectional view of the power semiconductor device 1000 according to exemplary embodiments taken along line A-A' of FIG. 2. FIG. 4 is an enlarged view of the bootstrap driving circuit of FIG. 2 and a schematic plan view of the structure shown in FIG. 3. In FIG. 4, conductive layers 141 to 145, a field oxide layer 146, and an upper insulating layer 147 are omitted, and a lower barrier region 120, an n-type buried layer 174, and an n-type lower layer 176 are not exposed over an upper surface, but shown with a dotted line.

Referring to FIGS. 3 and 4, a substrate 110 may include a semiconductor layer 114 disposed on a base substrate 112. In exemplary embodiments, the base substrate 112 may include a group V compound semiconductor substrate such as a silicon substrate, a germanium substrate, a silicon germanium substrate, a silicon carbide substrate, a group III-V compound semiconductor substrate such as a gallium arsenide substrate, or so forth. The base substrate 112 may include p-type impurities at a low concentration. For example, the base substrate 112 may have a p-type impurity concentration of about 1E12 to about 1E14 $cm^{-3}$.

The semiconductor layer 114 may include an n-type epitaxial layer that is grown on the base substrate 112 through an epitaxial process. In exemplary embodiments, the semiconductor layer 114 may include a group V compound semiconductor such as silicon, germanium, silicon germanium, silicon carbide, a group III-V compound semiconductor such as gallium arsenide, and so forth. For example, the semiconductor layer 114 may include a silicon layer grown on a silicon substrate to a certain height by a selective epitaxial growth process. The semiconductor layer 114 may include the same material as that of the base substrate 112, but is not limited thereto. The semiconductor layer 114 may include a different material from the base substrate 112.

A first isolation layer 214 that extends in a vertical direction from an upper portion of the base substrate 112 to an upper surface of the semiconductor layer 114 may be disposed in a first isolation region 212. The first isolation layer 214 may include a lower isolation layer 216, which is doped with impurities at a low doping concentration, and an upper isolation layer 218 positioned on the lower isolation layer 216. The first isolation layer 214 may serve (e.g., function) as an isolation region that isolates the low-voltage region 202 and the diode part 102 from each other.

A ground region 152 may be formed inside the upper isolation layer 218. A ground contact 154 connected with the ground region 152 may be formed. The ground contact 154 may be connected to a ground terminal GND through a fifth conductive layer 145. The first isolation layer 214 and the base substrate 112 may be grounded through the ground terminal GND.

A second isolation layer 224 that extends in a vertical direction from the upper portion of the base substrate 112 to the upper surface of the semiconductor layer 114 may be disposed in a second isolation region 222. The second isolation layer 224 may include a lightly-doped lower isolation layer 226 and an upper isolation layer 228 positioned on (e.g., disposed on) the lower isolation layer 226. The second isolation layer 224 may serve as an element isolation region that isolates the high-voltage region 302 and the JFET part 104 from each other.

Between the first isolation region 212 and the second isolation region 222, the diode part 102 and the JFET part 104 may be connected in series with each other to form an electrical path. In addition, the JFET part 104 and the diode part 102 may be formed to directly connect with each other without an additional isolation region therebetween, and thus the power semiconductor device 1000 may have a compact size.

A first region I and a second region II that are in contact with each other in a direction parallel to an upper surface of the substrate 110 may be defined in the substrate 110. The diode part 102 may be disposed in the first region I of the substrate 110, and the JFET part 104 may be disposed in the second region II of the substrate 110. The first region I of the substrate 110 includes a first region I of the base substrate 112 and a first region I of the semiconductor layer 114, and the second region II of the substrate 110 includes a second region II of the base substrate 112 and a second region II of the semiconductor layer 114.

The diode part 102 will be described below.

The lower barrier region 120 may be disposed in the first region I of the substrate 110. The lower barrier region 120 may be formed from the upper portion of the base substrate 112 to a part adjacent to a bottom of the semiconductor layer 114. Although an upper surface of the lower barrier region 120 is shown in FIG. 3 as being positioned at a higher level than an upper surface of the base substrate 112, the upper surface of the lower barrier region 120 may be positioned at or positioned substantially at the same level as the upper surface of the base substrate 112. The lower barrier region 120 may be disposed on or substantially disposed on an entire area of the first region I of the base substrate 112. The lower barrier region 120 may be an N+ region heavily doped with n-type impurities. For example, the impurity concentration of the lower barrier region 120 may be about 1E12 to about 1E15 $cm^{-3}$, but is not limited thereto. The lower barrier region 120 may serve as a barrier region that prevents a leakage current from flowing into the substrate 110 below.

A p-type body region 122 may be disposed in the first region I of the substrate 110. The p-type body region 122 may have a certain depth from the upper surface of the semiconductor layer 114 and may be disposed inside the upper portion of the semiconductor layer 114. The p-type body region 122 may be an impurity region heavily doped with p-type impurities. For example, the p-type body region 122 may have the impurity concentration of about 1E13 to about 1E15 $cm^{-3}$. However, the impurity concentration of the p-type body region 122 is not limited thereto.

An emitter region 124 may be disposed in an upper portion of the p-type body region 122 and inside the semiconductor layer 114. The emitter region 124 may be an impurity region heavily doped with p-type impurities. For example, the emitter region 124 may have the impurity concentration of about 1E15 to about 1E18 $cm^{-3}$, but is not limited thereto.

An emitter contact 125 electrically connected with the emitter region 124 may be disposed on the semiconductor layer 114. The emitter contact 125 may be electrically connected to a first conductive layer 141. The first conductive layer 141 may correspond to an anode terminal (not shown).

An n-type well 126 may be disposed at one side of the p-type body region 122 in the semiconductor layer 114. The n-type well 126 may be disposed adjacent to (or in contact with) the p-type body region 122 and inside the semiconductor layer 114 and may be disposed having a certain depth from the upper surface of the semiconductor layer 114. In exemplary embodiments, the n-type well 126 may be formed to a sufficiently large depth such that a bottom of the n-type well 126 is in contact with an upper portion of the lower barrier region 120, but is not limited thereto. A depth of the n-type well 126 from the upper surface of the semiconductor layer 114 may be greater than that of the p-type body region 122. That is, a bottom of the p-type body region 122 may be disposed at a higher level than the bottom of the n-type well 126. The n-type well 126 may be an impurity region heavily doped with n-type impurities. For example, the n-type well 126 may have the impurity concentration of about 1E12 to about 1E15 cm$^{-3}$. However, the impurity concentration of the n-type well 126 is not limited thereto.

A base region 128 may be disposed in an upper portion of the n-type well 126 and inside the semiconductor layer 114. The base region 128 may be an impurity region heavily doped with n-type impurities. For example, the impurity concentration of the base region 128 may be about 1E15 to about 1E18 cm$^{-3}$, but is not limited thereto.

A base contact 129 electrically connected with the base region 128 may be disposed on the semiconductor layer 114. The base contact 129 may be electrically connected to a second conductive layer 142.

A portion of the semiconductor layer 114 positioned below the p-type body region 122 may be defined as a first n-type semiconductor region 130. The first n-type semiconductor region 130 may be an impurity region which contains a low concentration of n-type impurity. Since the first n-type semiconductor region 130 may correspond to a portion of the semiconductor layer 114 formed through an epitaxial growth process, the first n-type semiconductor region 130 may have substantially the same impurity concentration as the n-type impurity doping concentration of the semiconductor layer 114. For example, the impurity concentration of the first n-type semiconductor region 130 may be about 1E10 to about 1E12 cm$^{-3}$, but is not limited thereto. An entire bottom surface of the first n-type semiconductor region 130 may be in contact with the lower barrier region 120, and an entire top surface of the first n-type semiconductor region 130 may be in contact with the bottom surface of the p-type body region 122. In addition, as illustrated in FIG. 4, the n-type well 126 may be disposed to surround the emitter region 124. Accordingly, a side wall of the first n-type semiconductor region 130 positioned below the emitter region 124 may be disposed to be surrounded by the n-type well 126. That is, the first n-type semiconductor region 130 may correspond to a portion of the semiconductor layer 114 that is defined by the lower barrier region 120, the p-type body region 122, and the n-type well 126.

The p-type body region 122 and the first n-type semiconductor region 130 may form a p-n junction diode. Since the p-n junction diode breaks down due to an avalanche phenomenon, the p-n junction diode may have a higher breakdown voltage $V_{BD}$ than a PNP transistor that breaks down due to a punch-through effect. In particular, when the breakdown voltage $V_{BD}$ of the diode part 102 is significantly higher than a pinch-off voltage $V_{pinch-off}$ of the JFET part 104, a bootstrap diode circuit may stably operate without damage to the diode part 102. Such characteristics will be described below in detail with reference to FIGS. 6A and 6B.

In the first region I of the semiconductor layer 114, a lateral p-type well 132 may be disposed on a side of the n-type well 126, and a lateral n-type well 136 may be disposed on a side of the lateral p-type well 132. That is, the n-type well 126, the lateral p-type well 132, and the lateral n-type well 136 may be sequentially disposed from the p-type body region 122 in a direction parallel to the upper surface of the substrate 110. The lateral p-type well 132 and the lateral n-type well 136 may prevent electrons from flowing from the p-type body region 122 in a direction parallel to the upper surface of the substrate 110 to serve as a barrier that reduces a leakage current. The lateral p-type well 132 and the lateral n-type well 136 may be impurity regions heavily doped with p-type impurities and n-type impurities, respectively. For example, the lateral p-type well 132 may have an impurity concentration of about 1E12 to about 1E15 cm$^{-3}$, and the lateral n-type well 136 may have an impurity concentration of about 1E12 to about 1E15 cm$^{-3}$. However, the impurity concentrations of the lateral p-type well 132 and the lateral n-type well 136 are not limited thereto.

A collector region 134 heavily doped with p-type impurities may be disposed in an upper portion of the lateral p-type well 132, and a source region 138 heavily doped with n-type impurities may be disposed in an upper portion of the lateral n-type well 136. A collector contact 135 and a source contact 139 may be disposed on the semiconductor layer 114 to be electrically connected with the collector region 134 and the source region 138, respectively.

The emitter contact 125 may be electrically connected with a driving voltage terminal (not shown) by the first conductive layer 141. The base contact 129 and the collector contact 135 may be connected in common with the second conductive layer 142. The second conductive layer 142 may be connected with the source contact 139.

The JFET part 104 will be described below. The JFET part 104 may be disposed in the second region II of the substrate 110, and an additional isolation region may not be formed between the JFET part 104 and the diode part 102.

A second n-type semiconductor region 160 may be defined in the second region II of the semiconductor layer 114. The second n-type semiconductor region 160 may be an impurity region which contains a low concentration of n-type impurity. Since the second n-type semiconductor region 160 may correspond to a portion of the semiconductor layer 114 formed through an epitaxial growth process of the semiconductor layer 114, the second n-type semiconductor region 160 may have substantially the same impurity concentration as the n-type impurity doping concentration of the semiconductor layer 114. The second n-type semiconductor region 160 may be a region lightly doped with n-type impurities, and may have an impurity concentration of about 1E10 to about 1E12 cm$^{-3}$. When the JFET part 104 is in an on state, the second n-type semiconductor region 160 may be a region where a channel providing an electrical path from an anode terminal (not shown) to a cathode terminal (not shown) is formed.

A p-type field forming layer 162 may be disposed on an upper portion of the second n-type semiconductor region 160 inside the semiconductor layer 114. The p-type field forming layer 162 may be a region heavily doped with p-type impurities. The p-type field forming layer 162 may have an impurity concentration of about 1E11 to about 1E14 cm$^{-3}$. However, the impurity concentration of the p-type field forming layer 162 is not limited thereto. When a high voltage is applied to the JFET part 104 (that is, when a high voltage is applied between the cathode terminal and the anode terminal), the p-type field forming layer 162 may prevent an electric field from being concentrated on the surface of the semiconductor layer 114 and thus block the surface of the semiconductor layer 114 from being damaged. That is, the p-type field forming layer 162 may be a reduced surface field region that prevents distortion of the electric field and thus damage of the second n-type semiconductor region 160. In addition, when a high voltage is applied to the JFET part 104, the p-type field forming layer 162 may completely deplete the second n-type semiconductor region 160 from the source region 138 to a drain region 170, and accordingly the JFET part 104 may have a high breakdown voltage.

A p-type well 164 is disposed in a portion of the semiconductor layer 114 adjacent to the p-type field forming layer 162, and a gate region 166 may be disposed in an upper portion of the p-type well 164. The p-type well 164 and the gate region 166 may be regions heavily doped with p-type impurities. The p-type well 164 may have an impurity concentration of about 1E13 to about 1E15 cm$^{-3}$, and the gate region 166 may have an impurity concentration of about 1E15 to about 1E18 cm$^{-3}$. However, the impurity concentrations of the p-type well 164 and the gate region 166 are not limited thereto. A gate contact 168 may be disposed on the gate region 166, and the gate contact 168 may be electrically connected with a third conductive layer 143. The third conductive layer 143 may correspond to a ground terminal (not shown) or may be connected with the ground terminal.

In the second region II of the semiconductor layer 114, the drain region 170 may be disposed apart from the gate region 166 with the p-type field forming layer 162 therebetween. The drain region 170 may be a region heavily doped with n-type impurities, and the drain region 170 may have an impurity concentration of about 1E15 to about 1E18 cm$^{-3}$. A drain contact 172 may be disposed on the drain region 170 and may be electrically connected with a fourth conductive layer 144. The fourth conductive layer 144 may correspond to a cathode terminal (not shown) or may be connected with the cathode terminal.

The n-type buried layer 174 may be disposed below the second n-type semiconductor region 160. The n-type buried layer 174 may be disposed from the upper portion of the base substrate 112 to a region adjacent to the bottom of the semiconductor layer 114. Although an upper surface of the n-type buried layer 174 is shown in FIG. 3 as being positioned at a higher level than an upper surface of the base substrate 112, the upper surface of the n-type buried layer 174 may be positioned at substantially the same level as the upper surface of the base substrate 112. At least one portion of the n-type buried layer 174 may overlap the p-type field forming layer 162 in a vertical direction (in a direction perpendicular to the upper surface of the substrate 110). The n-type buried layer 174 may be a region lightly doped with n-type impurities. The n-type buried layer 174 may have an impurity concentration of about 1E11 to about 1E13 cm$^{-3}$, but is not limited thereto. The n-type buried layer 174 may decrease a specific resistance of the second region II of the semiconductor layer 114, and thus an on-resistance of the JFET part 104 may be decreased. A cathode current may be increased with the decrease of the on-resistance of the JFET part 104.

The n-type lower layer 176 may be disposed in a portion of the base substrate 112 adjacent to the n-type buried layer 174. The n-type lower layer 175 may be a region heavily doped with n-type impurities and may have an impurity concentration of about 1E12 to about 1E15 cm$^{-3}$. In exemplary embodiments, the impurity concentration of the n-type lower layer 176 may be higher than that of the n-type buried layer 174. When a high voltage is applied to the JFET part 104, the n-type lower layer 176 may induce an electric field to be concentrated on the n-type lower layer 176, thereby preventing the drain region 170 from being destroyed.

The field oxide layer 146 and the upper insulating layer 147 may be sequentially disposed on the semiconductor layer 114, and the first to fifth conductive layers 141, 142, 143, 144, and 145 may be disposed on the upper insulating layer 147. A lower insulating layer 180 and the upper insulating layer 147 may be sequentially disposed on the p-type body region 122 and the emitter region 124.

Figure 5:
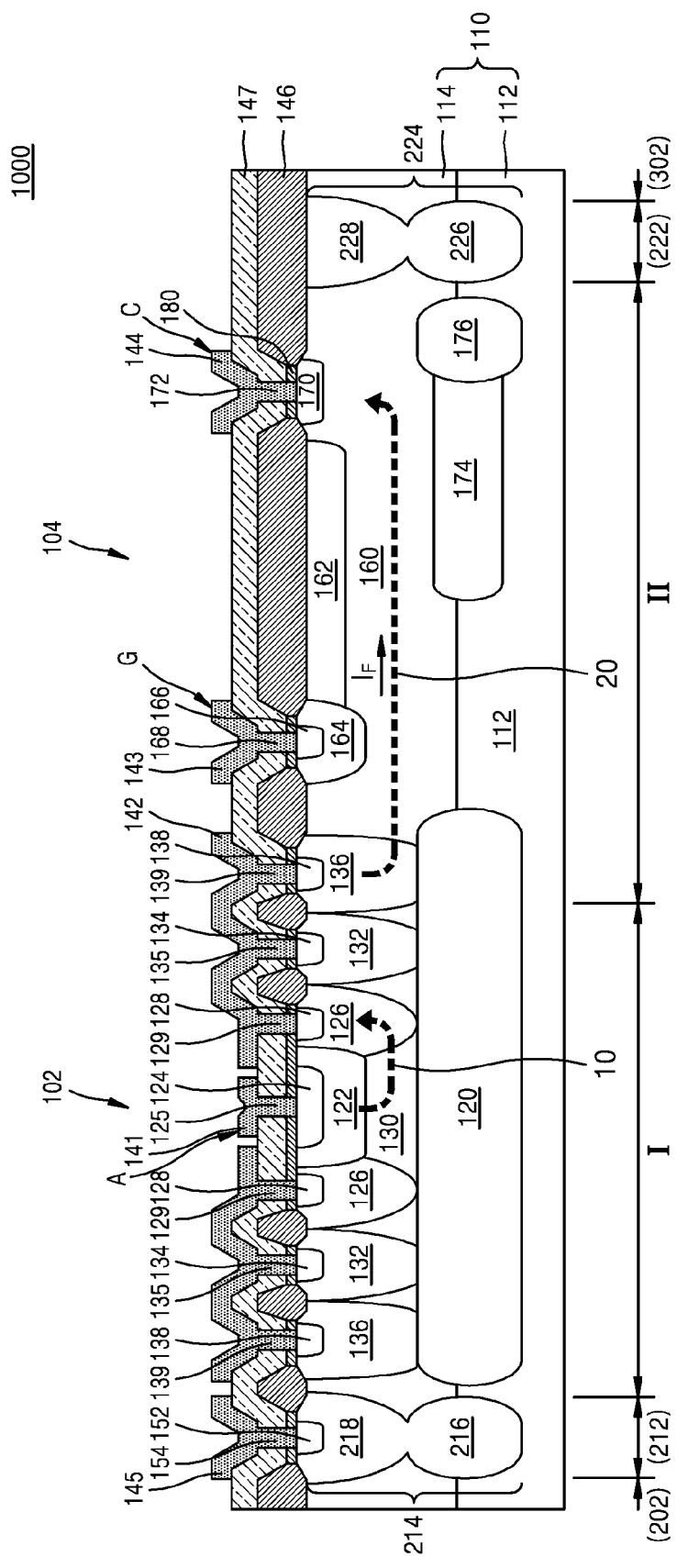
FIG. 5 is a cross-sectional view illustrating a driving method of a power semiconductor device according to exemplary embodiments.

FIG. 5 is a cross-sectional view illustrating a driving method of the power semiconductor device 1000 according to exemplary embodiments. In FIG. 5, the same numerals as shown in the power semiconductor device 1000 of FIG. 3 are used to refer to the same elements.

Referring to FIG. 5, the diode part 102 and the JFET part 104 may together provide an electrical path. The electrical path may include a first current path 10 provided within the diode part 102 and a second current path 20 provided within the JFET part 104. Accordingly, a path may be provided, through which an electric current flows from an anode terminal A, that is, the first conductive layer 141 connected to the emitter contact 125, to a cathode terminal C, that is, the fourth conductive layer 144 connected to the drain contact 172.

In exemplary embodiments, the p-type body region 122 of the diode part 102 may be a region doped with p-type impurities, and the first n-type semiconductor region 130 disposed below the p-type body region 122 may be a region doped with n-type impurities. Accordingly, the p-type body region 122 and the first n-type semiconductor region 130 may form a p-n junction diode at an interface therebetween. When a positive voltage is applied between the anode terminal A and the cathode terminal C (that is, when a potential of the anode terminal A is higher than that of the cathode terminal C), the p-n junction diode of the diode part 102 may be forward biased. The second conductive layer 142 may be a floating electrode. During forward bias of the p-n junction diode, the first current path 10 may be defined between the p-type body region 122 and the n-type well 126. As illustrated in FIG. 5, the first current path 10 may be formed to permit the current to move from the p-type body region 122, through the first n-type semiconductor region 130, to the n-type well 126. Alternatively, the first current path 10 may be defined, permitting the current to move from the p-type body region 122 to the n-type well 126, without passing through the first n-type semiconductor region 130. Accordingly, with the diode part 102 in the forward conduction state, the current may flow along the first current path 10 from the anode terminal A to the second conductive layer 142.

A channel (not shown) may be formed in the second n-type semiconductor region 160 of the JFET part 104, and the channel may have an n-type conductivity. When the diode part 102 is forward biased, the JFET part 104 may be configured such that the forward current $I_F$ flows through the channel. That is, the JFET part 104 may be in an on-state. In this case, a ground terminal G, that is, the third conductive layer 143 connected to the gate contact 168, may be maintained at a ground voltage, allowing the diode part 102 to be forward biased. The channel may be formed on substantially the entire area inside the second n-type semiconductor region 160. Referring to FIG. 5, the approximate direction of the forward current $I_F$ flowing through the channel is indicated by a dotted arrow, from which it is understandable that the second current path 20 refers to a portion of the channel which is formed within the second n-type semiconductor region 160. The current flowing from the anode terminal A, along the first current path 10, to the second conductive layer 142 may flow from the lateral n-type well 136, along the channel (e.g., along the second current path 20), to the cathode terminal C. The n-type buried layer 174 of the JFET part 104 may be disposed below the second n-type semiconductor region 160 and may decrease a specific resistance of the semiconductor layer 114 in an on-state. Accordingly, the forward current $I_F$ may be increased.

When a negative voltage is applied between the anode terminal A and the cathode terminal C (that is, when a potential of the anode terminal A is lower than that of the cathode terminal C), the p-n junction diode of the diode part 102 may be reverse biased, and an electric current may not flow between the anode terminal A and the cathode terminal C. At least a portion of the channel of the JFET part 104 may be depleted by the negative voltage applied between the anode terminal A and the cathode terminal C, and an electrical current may not flow between the anode terminal A and the cathode terminal C by the depleted at least one portion of the channel.

In exemplary embodiments, the breakdown voltage $V_{BD}$ of the diode part 102 may be higher than the pinch-off voltage $V_{pinch-off}$ of the JFET part 104. For example, the breakdown voltage $V_{BD}$ of the diode part 102 may be about 2 volts higher than the pinch-off voltage $V_{pinch-off}$ of the JFET part 104. On a condition that the diode part 102 is in the break down voltage $V_{BD}$ state, when a cathode potential increases, a first depletion region (not shown) between the p-type well 164, which is a p-type impurity region in the JFET part 104, and the second n-type semiconductor region 160, which is disposed therebelow, may extend toward the base substrate 112 in a direction perpendicular to the upper surface of the substrate 110. In addition, on a condition that the diode part 102 is in the break down voltage $V_{BD}$ state, when the cathode potential increases, a second depletion region (not shown) between the base substrate 112, which is a p-type impurity region in the JFET part 104, and the second n-type semiconductor region 160, which is disposed thereabove, may extend toward the p-type well 164 in a direction perpendicular to the upper surface of the substrate 110. When the cathode potential is further increased, the first depletion region and the second depletion region may be in contact with each other. In this case, a voltage applied between the cathode terminal C and the anode terminal A may be referred to as a pinch-off voltage $V_{pinch-off}$. When the pinch-off voltage $V_{pinch-off}$ of part the JFET 104 is higher than the breakdown voltage $V_{BD}$ of the diode part 102, a potential applied to the diode part 102 may become greater than the breakdown voltage $V_{BD}$. Thus, when the JFET part 104 is in an off-state (that is, when is the diode part 102 is reverse biased), the diode part 102 may be damaged.

The pinch-off voltage $V_{pinch-off}$ of the JFET part 104 may vary mainly depending on a thickness and a specific resistance of the semiconductor layer 114, and variation in the pinch-off voltage $V_{pinch-off}$ of the JFET part 104 may be associated with the precise control of the thickness and specific resistance of the semiconductor layer 114. That is, during a process of forming the semiconductor layer 114, when the thickness and/or specific resistance of the semiconductor layer 114 (e.g., the specific resistance of the semiconductor layer 114 caused by impurities with which the semiconductor layer 114 is doped) may be precisely adjusted, the distribution of the pinch-off voltage $V_{pinch-off}$ may be reduced. However, when the semiconductor layer 114 is grown by an epitaxial process, it is relatively difficult to precisely adjust the thickness and/or specific resistance of the semiconductor layer 114 (or a concentration of the doping impurities in the process of forming the semiconductor layer 114). Thus, the variation in the pinch-off voltage $V_{pinch-off}$ of the JFET part 104 may be relatively large. When the breakdown voltage $V_{BD}$ of the diode part 102 is significantly higher than a pinch-off voltage $V_{pinch-off}$ of the JFET part 104, the power semiconductor device 1000 may operate stably although the pinch-off voltage $V_{pinch-off}$ of the JFET part 104 varies significantly. The power semiconductor device 1000 may have a substantially large value of breakdown voltage $V_{BD}$ of the diode part 102 than the pinch-off voltage $V_{pinch-off}$ of the JFET part 104, since the p-type body region 122 and the first n-type semiconductor region 130 of the diode part 102 construct the p-n junction diode. As a result, the power semiconductor device 1000 can drive stably. Such breakdown characteristics will be described with reference to FIGS. 6A and 6B.

Figure 6A:
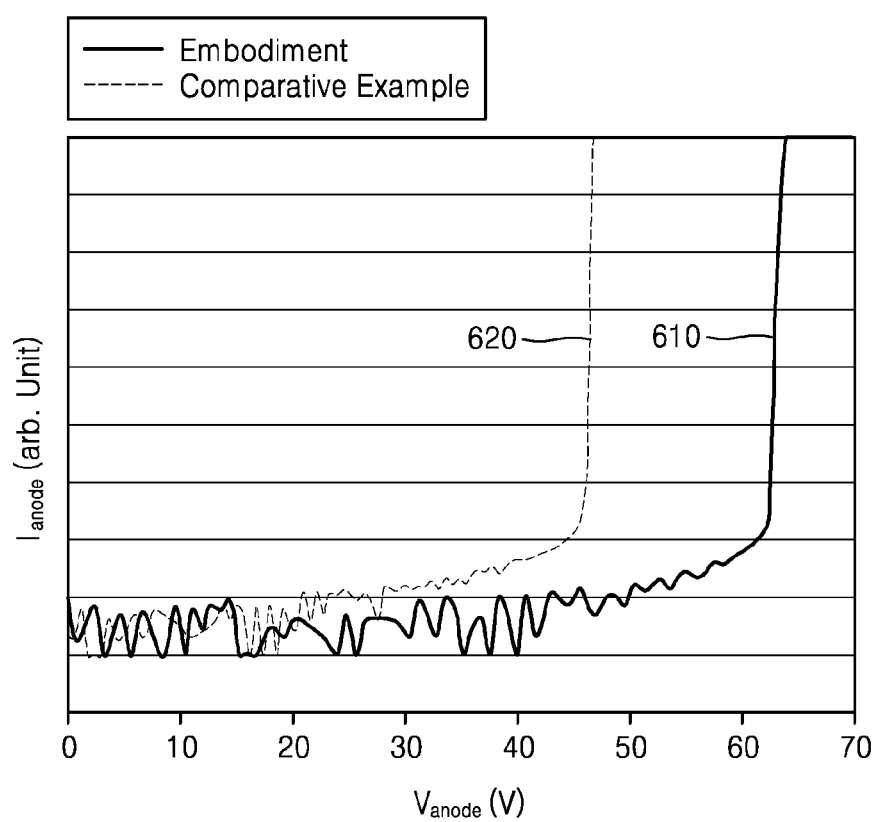
FIGS. 6A and 6B are simulation results showing breakdown characteristics of a power semiconductor device according to exemplary embodiments.
Figure 6B:
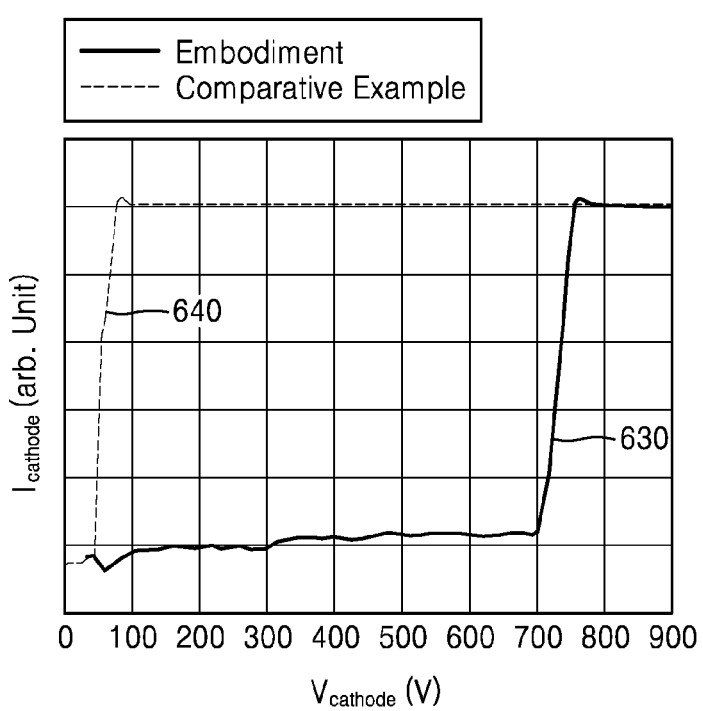

FIGS. 6A and 6B are simulation results showing breakdown characteristics of a power semiconductor device according to exemplary embodiments. FIG. 6A is a graph indicating an anode current with respect to an anode voltage of a power semiconductor device according to exemplary embodiments, and FIG. 6B is a graph indicating a cathode current with respect to a cathode voltage of a power semiconductor device according to exemplary embodiments. FIGS. 6A and 6B also show graphs indicating an anode current and a cathode current of a power semiconductor device according to a comparative example.

A graph of an anode current with respect to an anode voltage of a power semiconductor device 610 according to exemplary embodiments and a graph of an anode current with respect to an anode voltage of a power semiconductor device 620 according to a comparative example are compared with each other and shown in FIG. 6A.

The power semiconductor device 620 according to the comparative example may include a PNP transistor structure connected to an anode terminal. In detail, the power semiconductor device 620 according to the comparative example may include an n-type semiconductor layer region and a p-type semiconductor layer region that are sequentially disposed in a lower portion of the p-type body region connected with the anode terminal. The power semiconductor device 620 according to the comparative example may have a similar structure to that disclosed in U.S. Patent Publication No. 2010/0271079, published on Oct. 28, 2010, which is incorporated herein by reference in its entirety.

It can be seen from FIG. 6A that while the power semiconductor device 620 according to the comparative example has an anode breakdown voltage of about 47 volts, the power semiconductor device 610 according to exemplary embodiments has an anode breakdown voltage of about 65 volts. In the power semiconductor device 620 according to the comparative example, breakdown may occur in the PNP transistor structure due to a punch-through effect. However, in the power semiconductor device 610 according to exemplary embodiments, the diode part forms a p-n junction diode, and breakdown may occur in the diode part due to an avalanche phenomenon. Accordingly, the power semiconductor device 610 may have a further increased breakdown voltage. For example, the power semiconductor device 610 according to exemplary embodiments may have an approximately 18 volts higher breakdown voltage than the power semiconductor device 620 according to the comparative example.

A graph of a cathode current with respect to a cathode voltage of the power semiconductor device 630 according to exemplary embodiments and a graph of a cathode current with respect to a cathode voltage of the power semiconductor device 640 according to the comparative example are compared with each other and shown in FIG. 6B. The power semiconductor device 630 according to exemplary embodiments corresponds to a case in which an anode breakdown voltage of a diode part is greater than a pinch-off voltage of a JFET part ($V_{anode\ BV} > V_{pinch-off}$). The power semiconductor device 640 according to the comparative example corresponds to a case in which the anode breakdown voltage is less than the pinch-off voltage ($V_{anode\ BV} < V_{pinch-off}$).

When the cathode potential increases in an off-state of the JFET part, the cathode potential may be maintained even in the diode part. For the power semiconductor device 640 according to the comparative example, since a breakdown voltage of the diode part is lower than a pinch-off voltage of the JFET part, a cathode potential may increase over the breakdown voltage of the diode part, and breakdown may occur in the diode part. Accordingly, the power semiconductor device 640 according to the comparative example cannot be maintained in an off-state. For example, the cathode current may rapidly increase at the cathode voltage of about 50 volts. This may damage the diode part. That is, the power semiconductor device 640 according to the comparative example cannot maintain (or block) a high voltage of the JFET part.

However, for the power semiconductor device 630 according to exemplary embodiments, since a breakdown voltage of the diode part is higher than a pinch-off voltage of the JFET part, breakdown may not occur in the diode part when a cathode potential reaches the pinch-off voltage. After the JFET part reaches the pinch-off voltage, a potential of the pinch-off voltage is maintained in the diode part. Thus the power semiconductor device 630 according to exemplary embodiments may be maintained in an off state even at a high voltage. For example, since the cathode current hardly flows until the cathode voltage of about 700 volts, the power semiconductor device 630 may be maintained in an off state.

FIGS. 7A to 7D are cross-sectional views showing a manufacturing method of a power semiconductor device according to exemplary embodiments. In particular, a manufacturing method of a bootstrap driving circuit 100 of the power semiconductor device described with reference to FIGS. 2 to 4 will be mainly described with reference to FIGS. 7A to 7D.

Figure 7A:
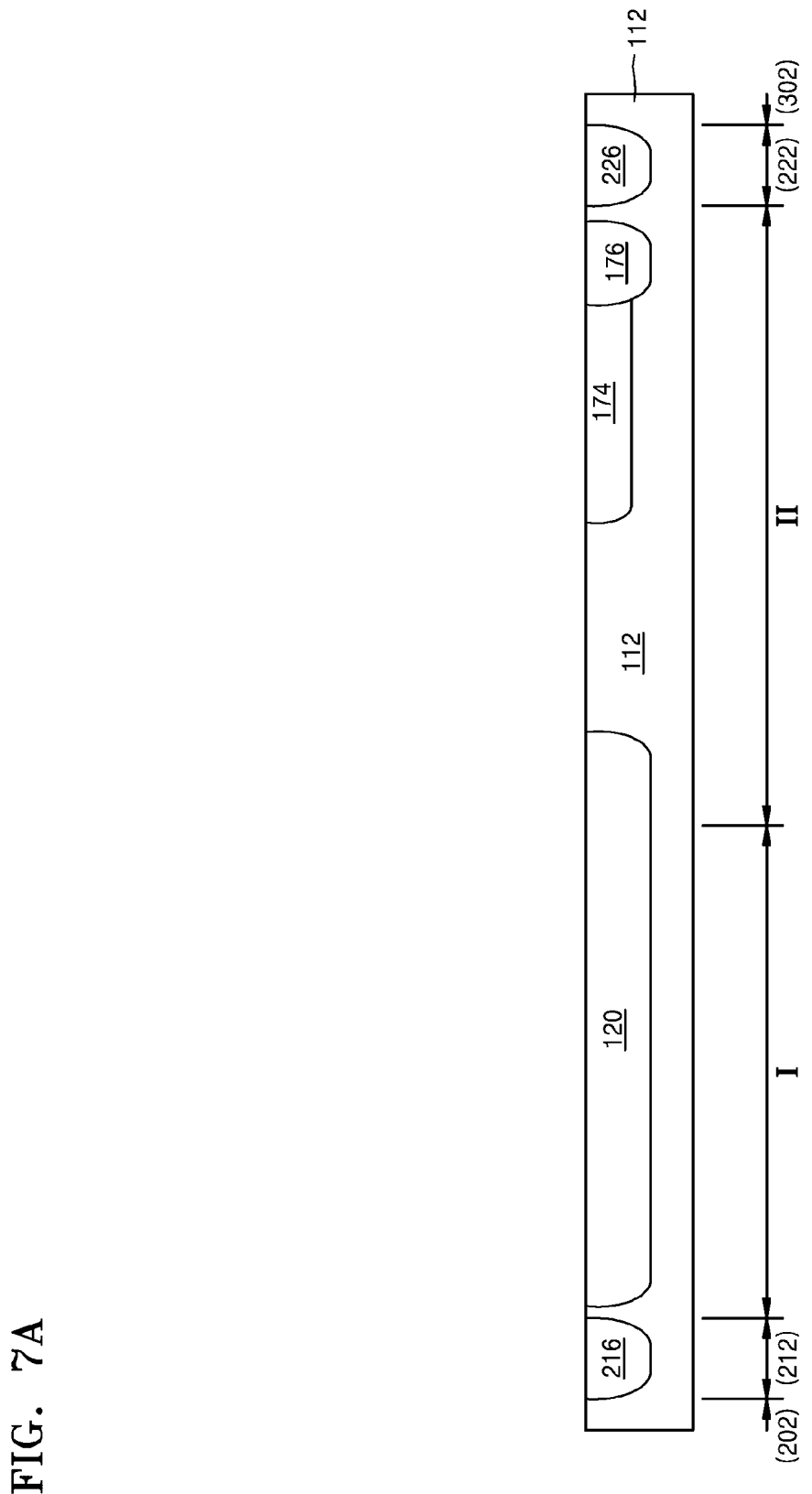
FIGS. 7A to 7D are cross-sectional views showing a manufacturing method of a power semiconductor device according to exemplary embodiments.

Referring to FIG. 7A, a base substrate 112 may be provided in which a first isolation region 212, a first region I, a second region II, and a second isolation region 222 are defined. Through a first ion implantation process, a lower barrier region 120 may be formed in the first region I of the base substrate 112, and an n-type lower layer 176 may be formed in the second region II of the base substrate 112 by implanting n-type impurity ions into portions of the first region I and the second region II of the base substrate 112. A dose of the impurity ions used in the first ion implantation process may be about 1E12 to about 1E15 cm$^{-3}$, but is not limited thereto. Selectively, a thermal treatment process for diffusing the implanted n-type impurity ions may be further performed.

Subsequently, through a second ion implantation process, an n-type buried layer 174 may be formed by implanting n-type impurity ions into the second region II of the base substrate 112. In this case, ion implantation energy in the second ion implantation process may be about 50 to 200 keV, but is not limited thereto. A dose of the impurity ions used in the second ion implantation process may be about 1E11 to about 1E13 cm$^{-3}$, but is not limited thereto.

Through a third ion implantation process, lower isolation layers 216 and 226 may be formed by implanting p-type impurity ions into the first isolation region 212 and the second isolation region 222 of the base substrate 112. Selectively, a thermal treatment process for diffusing the implanted p-type impurity ions may be further performed.

Figure 7B:
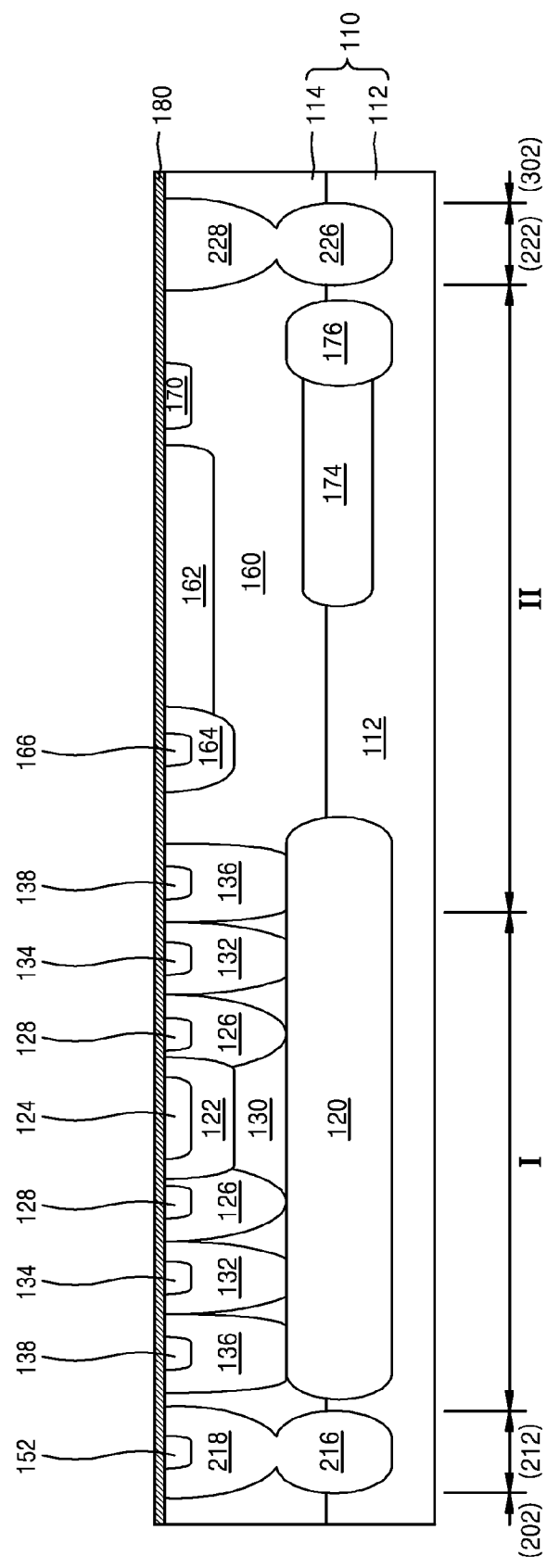

Referring to FIG. 7B, a semiconductor layer 114 may be formed to a certain thickness on an entire area of the base substrate 112 through a selective epitaxial growth process. A thickness of the semiconductor layer 114 may be about 1 to 10 micrometers, but is not limited thereto. The n-type impurity ions may be in-situ doped in a process of growing the semiconductor layer 114, and thus the semiconductor layer 114 may have an impurity concentration of about 1E10 to about 1E12 cm$^{-3}$. For example, the semiconductor layer 114 may have a specific resistance of about 1 to 30 Ωcm, which is merely an illustrative value, but is not limited thereto.

A lower insulating layer 180 may be formed to a certain thickness on the semiconductor layer 114.

Subsequently, through a fourth ion implantation process, an n-type well 126 and a lateral n-type well 136 may be formed by implanting n-type impurity ions into the first region I of the semiconductor layer 114. A dose of the impurity ions used in the fourth ion implantation process may be about 1E12 to about 1E15 cm$^{-3}$, but is not limited thereto.

In exemplary embodiments, the fourth ion implantation process for forming the n-type well 126 and the lateral n-type well 136 may be performed by a plurality of ion implantation operations having different doses of impurity ions. For example, the fourth ion implantation process may be performed by sequentially performing a first ion implantation operation in which the dose of the impurity ions is low and a second ion implantation operation in which the dose of the impurity ions is high. In this case, the n-type well 126 and the lateral n-type well 136 may be formed to include a plurality of sub-wells that have different impurity concentrations, that is, that have a distribution of the impurity concentrations.

Subsequently, through a fifth ion implantation process, a lateral p-type well 132 may be formed by implanting p-type impurity ions into the first region I of the semiconductor layer 114, and upper isolation layers 218 and 228 may be formed by implanting the p-type impurity ions into the first and second isolation regions 212 and 222. A dose of the impurity ions used in the fifth ion implantation process may be about 1E12 to about 1E15 cm$^{-3}$, but is not limited thereto. Selectively, a thermal treatment process for diffusing the implanted p-type impurity ions may be further performed.

The n-type impurities and p-type impurities implanted into the base substrate 112 by the thermal treatment process may diffuse into the semiconductor layer 114 to a certain height. Thus, upper portions of the lower barrier region 120, the n-type buried layer 174, and the n-type lower layer 176 may be positioned at a higher level than an upper portion of the base substrate 112.

Subsequently, through a sixth ion implantation process, a p-type well 164 may be formed by implanting p-type impurity ions into the second region II of the semiconductor layer 114, and a p-type body region 122 may be formed by implanting p-type impurity ions into the first region I of the semiconductor layer 114. A dose of the impurity ions used in the sixth ion implantation process may be about 1E13 to about 1E15 cm$^{-3}$, but is not limited thereto.

Subsequently, through a seventh ion implantation process, a p-type field forming layer 162 may be formed by implanting p-type impurity ions into the second region II of the semiconductor layer 114, and a ground region 152 may be formed by implanting p-type impurity ions into the upper isolation layer 218 of the first isolation region 212. A dose of the impurity ions used in the seventh ion implantation process may be about 1E11 to about 1E14 cm$^{-3}$, but is not limited thereto. Selectively, a thermal treatment process for diffusing the implanted p-type impurity ions may be further performed.

Figure 7C:
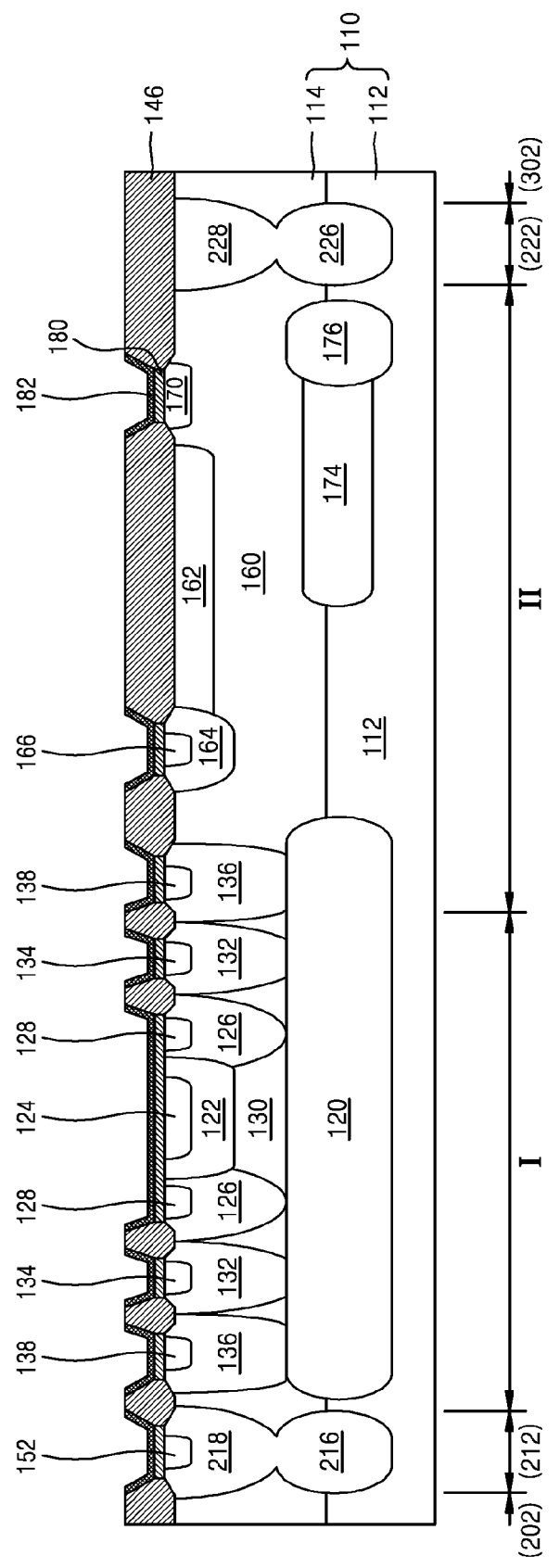

Referring to FIG. 7C, a hard mask layer 182 may be formed on the lower insulating layer 180, and then patterned to expose parts of the lower insulating layer 180 in which a field region is to be defined. Subsequently, a local oxidation of semiconductor (LOCOS) process may be performed to form a field oxide layer 146 on the exposed parts of the lower insulating layer 180. The field oxide layer 146 may be formed on remaining parts of the semiconductor layer 114, except for a part in which contact holes (not shown) are to be formed in subsequent processes and a part of the lower insulating layer 180 positioned on the p-type body region 122 and the emitter region 124. A thickness of the field oxide layer 146 may be about 400 nanometers to 2 micrometers, but is not limited thereto.

Figure 7D:
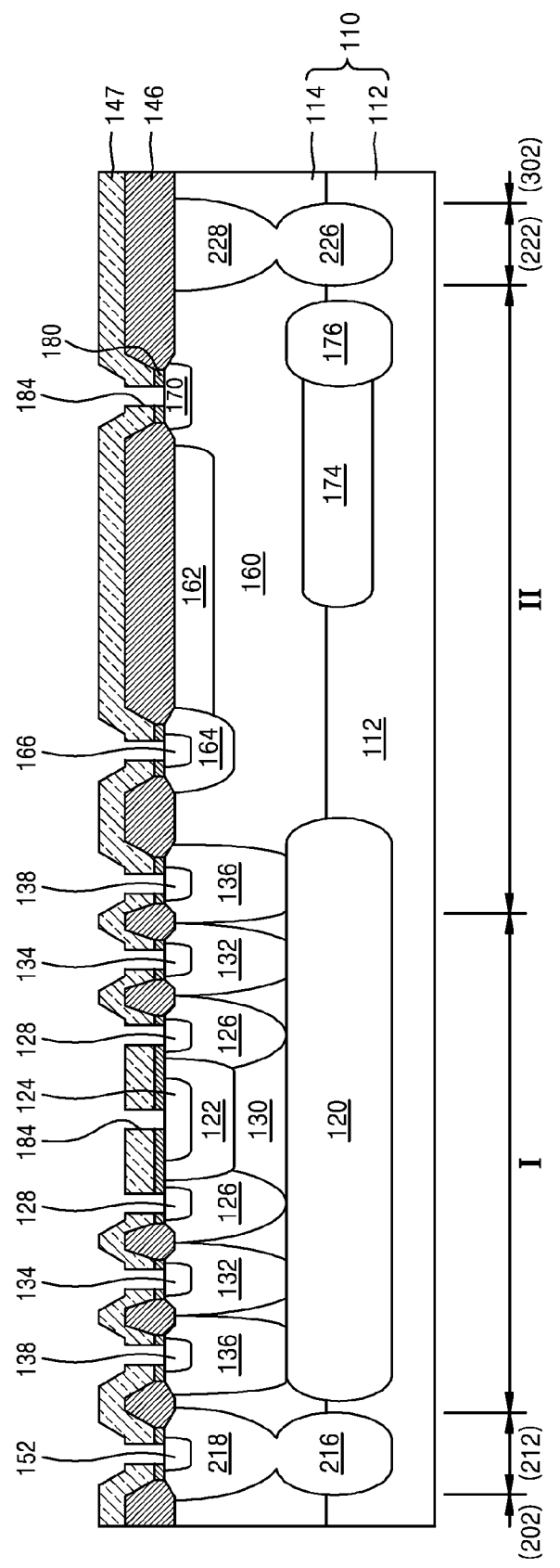

Referring to FIG. 7D, through an eighth ion implantation process, the emitter region 124 may be formed by implanting p-type impurity ions into the p-type body region 122 of the first region I of the semiconductor layer 114, and the collector region 134 may be formed by implanting the p-type impurity ions into the lateral p-type well 132. A dose of the impurity ions used in the eighth ion implantation process may be about 1E15 to about 1E18 cm$^{-3}$, but is not limited thereto.

Subsequently, through a ninth ion implantation process, a base region 128 may be formed by implanting n-type impurity ions into the n-type well 126 of the first region I of the semiconductor layer 114, and a source region 138 may be formed by implanting n-type impurity ions into the lateral n-type well 136. A dose of the impurity ions used in the ninth ion implantation process may be about 1E15 to about 1E18 cm$^{-3}$, but is not limited thereto.

Subsequently, the upper insulating layer 147 may be formed on the field oxide layer 146. The upper insulating layer 147 may be patterned to form the contact holes 184.

Referring back to FIG. 3, a conductive layer (not shown) is formed on the upper insulating layer 147, and the conductive layer is patterned to form the first to fifth conductive layers 141, 142, 143, 144, and 145 which fill the contact holes 184. As illustrated in FIG. 3, the first conductive layer 141 may be electrically connected to the emitter region 124 by the emitter contact 125. The second conductive layer 142 may be electrically connected with the base region 128 by the base contact 129, electrically connected with the collector region 134 by the collector contact 135, and electrically connected with the source region 138 by the source contact 139. The third conductive layer 143 may be electrically connected to a gate region 166 by a gate contact 168, and the fourth conductive layer 144 may be electrically connected to a drain region 170 by a drain contact 172. The fifth conductive layer 145 may be electrically connected to the ground region 152 by the ground contact 154.

The power semiconductor device 1000 according to exemplary embodiments may be completed by performing the above-described process.

While the present inventive concept has been particularly shown and described with reference to exemplary embodiments thereof, it will be understood by those skilled in the art that various changes in forms and details may be made therein without departing from the scope of the inventive concept as defined by the following claims.

What is claimed is:

1. A method, comprising:
   implanting a lower barrier region of a first conductivity type in a diode part of a base substrate and a lower layer of the first conductivity type in a junction field effect transistor (JFET) part adjacent to the diode part of the base substrate;
   implanting a buried layer of the first conductivity type between the lower barrier region in the diode part and the lower layer in the JFET part;
   forming a semiconductor layer on the base substrate;
   diffusing a portion of the buried layer of the first conductivity type into the semiconductor layer;
   forming an anode terminal in the diode part; and
   forming a cathode terminal in the JFET part.

2. The method of claim 1, further comprising:
   forming a body region in the diode part, the diode part has an upper portion connected with the anode terminal.

3. The method of claim 2, further comprising:
   forming a well on one side of the body region, the well having a first impurity concentration, the well having an upper portion of a sidewall surrounding the body region.

4. The method of claim 3, wherein a bottom of the body region is positioned at a higher level than a bottom of the well.

5. The method of claim 1, further comprising:
   forming a body region in the diode part;
   forming a well on one side of the body region; and
   forming a semiconductor region disposed below the body region, the well having a lower portion of a sidewall surrounding the semiconductor region.

6. The method of claim 1, further comprising:
   forming a well having a bottom of the well in contact with a top of the lower barrier region.

7. The method of claim 1, further comprising:
   forming a body region in the diode part, the body region having a bottom not in contact with a top of the lower barrier region.

8. The method of claim 1, wherein the buried layer being aligned along an interface between the semiconductor layer and the base substrate.

9. The method of claim 1, wherein the semiconductor layer is a first semiconductor layer, the method further comprising:
   forming a body region in the diode part;
   forming a second semiconductor region defining a p-n junction diode with the body region.

10. The method of claim 1, wherein the semiconductor layer is a first semiconductor layer, the method further comprising:
    forming a second semiconductor region in contact with a top of the lower barrier region.

11. A method, comprising:
    implanting a lower barrier region of a first conductivity type in a diode part disposed in a first region of a base substrate and a lower layer of the first conductivity type in a junction field effect transistor (JFET) part in a second region adjacent to the first region of the base substrate;

implanting a buried layer of the first conductivity type in contact with the lower layer in the JFET part;

forming a semiconductor layer on the base substrate;

forming an anode terminal in the first region; and forming a cathode terminal in the second region.

12. The method of claim 11, further comprising:
forming a lower isolation layer lateral to the lower layer.

13. The method of claim 12, wherein the lower isolation later is a first isolation layer,
the method further comprising:
forming a second lower isolation layer lateral to the lower barrier layer.

14. A method, comprising:
forming, as part of a device, a semiconductor layer of a first conductivity type on a substrate of a second conductivity type;
forming a body region of the second conductivity type in the semiconductor layer and disposed in a diode part of the device;
forming a well of the first conductivity type on one side of the body region, and having a first impurity concentration, the well of the first conductivity type having an upper portion of a sidewall surrounding the body region, the semiconductor layer having a portion disposed below the body region and having a second impurity concentration lower than the first impurity concentration, the well of the first conductivity type having a lower portion of the sidewall surrounding the portion of the semiconductor layer;

forming a first lateral well of the second conductivity type adjacent to the well of the first conductivity type;

forming a second lateral well of the first conductivity type adjacent to and electrically connected to the first lateral well; and forming a JFET device in a JFET part of the device.

15. The method of claim 14, further comprising:
implanting a lower barrier region of a first conductivity type in the diode part of a base substrate and a lower layer of the first conductivity type in the JFET part adjacent to the diode part of the base substrate.

16. The method of claim 15, further comprising:
implanting a buried layer of the first conductivity type between the lower barrier region in the diode part and the lower layer in the JFET part.

17. The method of claim 14, wherein the body region in the diode part has an upper portion connected with an anode terminal.

18. The method of claim 14, wherein a bottom of the body region is positioned at a higher level than a bottom of the well.

19. The method of claim 14, further comprising:
implanting a lower barrier region of a first conductivity type in the diode part of a base substrate, the well having a bottom in contact with a top of the lower barrier region.

20. The method of claim 14, further comprising:
implanting a lower barrier region of a first conductivity type in the diode part of a base substrate, the body region having a bottom not in contact with a top of the lower barrier region.

* * * * *